US007005944B2

(12) United States Patent
Arai et al.

(10) Patent No.: US 7,005,944 B2
(45) Date of Patent: Feb. 28, 2006

(54) TRANSMISSION LINE TYPE NOISE FILTER WITH REDUCED HEAT GENERATION EVEN WHEN LARGE DC CURRENT FLOWS THEREIN

(75) Inventors: Satoshi Arai, Sendai (JP); Takayuki Inoi, Sendai (JP); Yoshihiko Saiki, Sendai (JP); Sadamu Toita, Sendai (JP)

(73) Assignee: NEC Tokin Corporation, Sendai (JP)

( * ) Notice: Subject to any disclaimer, the term of this patent is extended or adjusted under 35 U.S.C. 154(b) by 28 days.

(21) Appl. No.: 10/633,199

(22) Filed: Jul. 31, 2003

(65) Prior Publication Data

US 2004/0021528 A1 Feb. 5, 2004

(30) Foreign Application Priority Data

Jul. 31, 2002 (JP) ...................................... 2002/222925

(51) Int. Cl.
*H03H 7/00* (2006.01)

(52) U.S. Cl. ...................... 333/185; 333/81 R; 333/184

(58) Field of Classification Search ................. 333/185, 333/17.1, 81 R, 181, 182, 184; 363/44, 51
See application file for complete search history.

(56) References Cited

U.S. PATENT DOCUMENTS 3,453,564 A * 7/1969 Russell ..................... 333/81 R
3,753,159 A * 8/1973 Burwen ..................... 333/17.1
4,847,575 A * 7/1989 Ikeda ......................... 333/184
4,866,407 A * 9/1989 Ikeda ......................... 333/184
5,030,933 A * 7/1991 Ikeda ......................... 333/184
5,500,629 A * 3/1996 Meyer ........................ 333/181
6,314,008 B1 * 11/2001 Bao et al. ..................... 363/44
6,646,523 B1 * 11/2003 Arai et al. .................. 333/184
6,714,427 B1 * 3/2004 Barthold ....................... 363/51
6,762,656 B1 * 7/2004 Kobayashi et al. ......... 333/184
6,836,195 B1 * 12/2004 Arai et al. .................. 333/182
6,853,268 B1 * 2/2005 Harada ....................... 333/185

FOREIGN PATENT DOCUMENTS

GB 2 080 045 A 1/1982

* cited by examiner

*Primary Examiner*—Patrick Wamsley
(74) *Attorney, Agent, or Firm*—Frishauf, Holtz, Goodman & Chick, P.C.

(57) ABSTRACT

A transmission line type noise filter, which is connectable between a direct current power supply and an electrical load component to pass a coming DC current while attenuating a coming AC current, includes a first conductor, a dielectric layer, a second conductor as a cathode, a first anode (12), and a second anode. The first and the second conductors and the dielectric layer serve as a capacitance forming portion. The thickness of the first conductor is selected to substantially restrict temperature elevation of the first conductor, which is caused by DC direct current flowing in the first conductor.

6 Claims, 6 Drawing Sheets

TRANSMISSION LINE TYPE NOISE FILTER WITH REDUCED HEAT GENERATION EVEN WHEN LARGE DC CURRENT FLOWS THEREIN

This invention claims priority to prior Japanese patent application JP 2002-222925, the disclosure of which is incorporated herein by reference.

BACKGROUND OF THE INVENTION

The present invention relates to a noise filter that is mounted in an electronic device or electronic equipment for removing noise generated in the device or equipment.

Digital technologies are important technologies supporting IT (Information Technology) industries. Recently, digital circuit technologies such as LSI (Large Scale Integration) have been used in not only computers and communication-related devices, but also household electric appliances and vehicle equipment.

However, high-frequency noise currents generated in LSI chips or the like are spread from the LSI chips over wide ranges within circuit boards mounting the LSI chips by electric transmission including inductive coupling with signal wiring or ground wiring on the circuit boards, and further radiated as electromagnetic waves from the signal cables or the like around the circuit boards.

In a circuit comprising an analog circuit portion and a digital circuit portion, electromagnetic interference from the digital circuit portion to the analog circuit portion has become a serious problem.

As a countermeasure therefor, a technique of power supply decoupling is effective wherein an LSI chip as a source of generation of high-frequency current is separated from a DC power supply system in terms of high frequencies. Noise filters such as bypass capacitors have been used hitherto as decoupling elements. The operation principle of the power supply decoupling is simple and clear.

A capacitor conventionally used as a noise filter in an AC circuit forms a two-terminal lumped constant noise filter. A solid electrolytic capacitor, an electric double-layer capacitor, a ceramic capacitor or the like is often used therefor.

When carrying out removal of electrical noise in an AC circuit over a wide frequency band, inasmuch as a frequency band that can be dealt with by one capacitor is relatively narrow, different kinds of capacitors, for example, an aluminum electrolytic capacitor, a tantalum capacitor and a ceramic capacitor having different self-resonance frequencies, are provided in the AC circuit.

Conventionally, however, it has been bothersome to select and design a plurality of noise filters that are used for removing electrical noise of a wide frequency band. In addition, there has been a problem that the use of different kinds of noise filters makes the circuit high in cost, large in size, and heavy in weight.

Further, for dealing with higher-speed and higher-frequency digital circuits, noise filters are desired that can ensure decoupling over a high frequency band and exhibit low impedances even in the high frequency band.

However, the two-terminal lumped constant noise filters have difficulty in maintaining low impedances up to the high frequency band due to self-resonance phenomena of capacitors, and thus are inferior in performance of removing high-frequency band noise.

Therefore, a noise filter is requested that is excellent in noise removing characteristic over a wide band including a high frequency band and that has a small size and a simple structure.

In order to respond to the request mentioned above, attention is given to a transmission line type noise filter, which is connectable between a power supply and an electrical load component such as the LSI chip and can pass coming DC current while attenuating coming AC current.

However, because the DC current to be supplied to the electrical load component passes in the transmission line type noise filter, heat is generated in the transmission line type noise filter. Therefore, the transmission line type noise filter is serious in heat generation for use in an electrical circuit having a large DC current flowing therein, and the life of the transmission line type noise filter is therefore shortened.

SUMMARY OF THE INVENTION

It is therefore an object of the present invention to provide a transmission line type noise filter with reduced heat generation even when a large DC current flows therein.

It is therefore another object of the present invention to provide the transmission line type noise filter that is excellent in noise removing characteristic over a wide band including a high frequency band and that has a small size and a simple structure.

A transmission line type noise filter according to the present invention is connectable between a direct current (DC) power supply (70) and an electrical load component (80) and can pass a coming DC current while attenuating a coming AC current. The transmission line type noise filter comprises a first conductor (11) formed in a plate and having a length (L) along a first direction (X) parallel to a transmission line, a width (W) along a second direction (Y) perpendicular to the first direction (X), and a thickness (t) along a third direction (Z) perpendicular to the first and the second directions (X, Y), a dielectric layer (30) formed on the first conductor (11), a second conductor (20) formed on the dielectric layer (30), a first anode (12) connected to one end portion of the first conductor (11) in the first direction (X) for connecting the first conductor (11) to the direct current power supply (70), and a second anode (13) connected to the other end portion of the first conductor (11) in the first direction (X) for connecting the first conductor (11) to the electrical load component (80). The second conductor (20) serves as a cathode connectable to a standard potential. The first and the second conductors (11, 20) and the dielectric layer (30) serve as a capacitance forming portion (50). The thickness (t) of the first conductor (11) is selected to substantially restrict temperature elevation in the first conductor (11) caused by a DC current flowing in the first conductor (11).

The first conductor (11) may be made essentially of valve-operational metal and an oxidized film of the valve-operational metal can make the dielectric layer (30).

In an embodiment, the valve-operational metal is aluminum, and the thickness (t) of the first conductor (11) is selected not more than 2.0 mm.

In another embodiment, valve-operational metal is tantalum and the thickness (t) of the first conductor (11) is selected not more than 1.5 mm.

In another embodiment, the valve-operational metal is niobium and the thickness (t) of the first conductor (11) is selected not more than 1.0 mm.

In a preferred embodiment, the first conductor (11) and the first and the second anode (12, 13) are integrally formed in a form of a metal sheet.

Other objects, features, and advantages of the present invention will become apparent from reading the following detailed description of this specification.

BRIEF DESCRIPTION OF THE DRAWINGS

FIGS. 1A, 1B, and 1C are diagrams showing an exemplary structure of a transmission line type noise filter according to a preferred embodiment of the present invention, wherein FIG. 1A is a plan view, FIG. 1B is a sectional view taken along a line 1B—1B in FIG. 1A, and FIG. 1C is another sectional view taken along a line 1C—1C in FIG. 1A;

DESCRIPTION OF THE PREFERRED EMBODIMENTS

Now, transmission line type noise filters according to preferred embodiments of the present invention will be described hereinbelow with reference to the drawings.

Figures 1A, 1B, 1C:
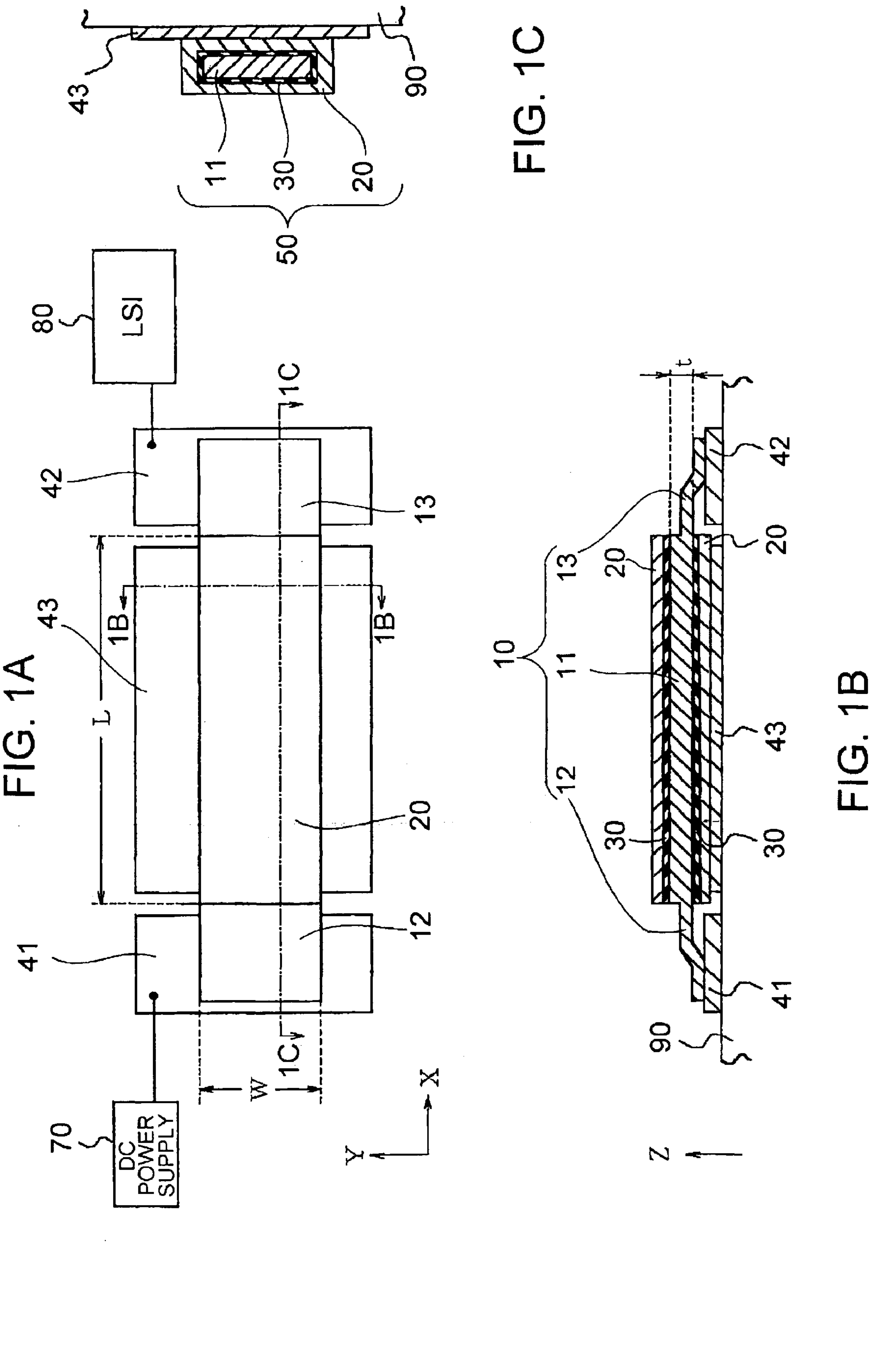

Referring to FIGS. 1A to 1C, a transmission line type noise filter according to an embodiment of the present invention is connectable between a direct current power supply (DC power supply) 70 and an LSI chip 80 as an electrical load component and can pass a coming direct current while can attenuate a coming alternating current.

The transmission line type noise filter comprises a first conductor 11, a dielectric layer 30, a second conductor 20, a first anode 12, and a second anode 13.

The first conductor 11 is plate-shaped and has a length L along a first direction X parallel to a transmission line, a width W along a second direction Y perpendicular to the first direction X, and a thickness t along a third direction Z perpendicular to the first and the second directions X, Y. The dielectric layer 30 is formed as a film on and around the first conductor 11 in the manner such that opposite ends of the first conductor 11 in the first direction X are exposed. The second conductor 20 is also formed as a film layer on and around the dielectric layer 30. The first anode 12 is connected to one end portion of the first conductor 11 in the first direction X. The first anode 12 is for connecting the first conductor 11 to the DC power supply 70. The second anode 13 is connected to the other end portion of the first conductor 11 in the first direction X. The second anode 13 is for connecting the first anode 11 to the LSI chip 80. Furthermore, the second conductor 20 serves as a cathode connectable to a ground line as a standard potential.

For example, the first conductor 11 used in the transmission line type noise filter as a product has the length L of 7.3 or 15.0 mm and the width W of 4.3 or 11.0 mm.

The first and the second conductors 11, 20 and the dielectric layer 30 serve as a capacitance forming portion 50.

The first conductor 11 and the first and the second andodes 12, 13 may be integrally formed of an etched aluminum foil 10 in a metal sheet.

The first anode 12, the second anode 13, and the second conductor 20 as the cathode are mounted and electrically connected on first, second and third lands 41, 42, and 43 formed on a circuit board 90 by soldering, respectively. The first and the second lands 41 and 42 are connected to a power output terminal of the DC power supply 70 and a power input terminal of the LSI chip, respectively. The third land 43 is connected to the ground line (not shown), which is the standard potential common to the DC power supply 70 and the LSI chip 80.

The transmission line type noise filter can be structured as an electric chip by covering the filter (packaging) with resin except electrical connecting portions or terminals (not shown) of the first anode 12, the second anode 13, and the second conductor 20.

Aluminum (Al), which is a material of the etched aluminum foil 10, is a kind of valve-operational metal. In the present invention, a valve-operational metal is a metal that, when oxidized, forms an oxide film, which performs a valve operation. Accordingly, the dielectric 30 can be formed by an oxidized aluminum film of the etched aluminum foil 10 as the first conductor 11. Although the thickness of the dielectric 30 is, for example, 1 $\mu$m, it is shown in FIGS. 1B and 1C with a thickness more than the actual thickness thereof so as to help in order to facilitate understanding the structural relationship among components of the filter according to the present invention. On the other hand, the second conductor 20 comprises a solid electrolyte layer, a graphite layer, and a silver coating layer formed on the dielectric layer 30 in this order. Although the thickness of the second conductor 20 is, for example, 50 $\mu$m, the second conductor 20 is also shown in FIGS. 1B and 1C with a thickness more than the actual thickness thereof.

The reason why the aluminum foil is etched is to make the surface of the aluminum foil rough and thus to increase the surface area of the dielectric oxide film formed on the foil, which leads to achievement of a high capacitance.

In the present invention, the valve-operational metal is not limited to aluminum, but tantalum (Ta) or niobium (Nb) can also be used. In use of Ta or Nb, it is preferable that the first conductor 11 is formed by sintering powder or a green sheet of tantalum or niobium in vacuum atmosphere. Tantalum or niobium sintered body has a rough surface, and thus the surface area thereof is relatively large. Therefore, the area of an oxidized film, as the dielectric 30, formed on a surface of the sintered body is also relatively large. Thus, the transmission line type noise filter can be obtained with a high capacitance.

As described in detail hereinbelow, the thickness t of the first conductor 11 should be selected to substantially restrict the temperature elevation of the first conductor 11 caused due to heat generation when a DC current flows in the first conductor 11.

The transmission line type noise filter, which is connected between the DC power supply 70 and the LSI chip 80 through the circuit board 90, passes a coming DC current while attenuating a coming AC current. Namely, the DC current supplied to the LSI chip 80 flows in the etched aluminum foil 10 in the form of a metal sheet.

The DC current is input in the first land 41, passes through the first anode 12, the first conductor 11, and the second anode 13, and is thus output from the second land 42. In this case, Joule heating is generated in the etched aluminum foil 10, particularly in the first conductor 11. The temperature of the transmission line type noise filter is therefore increased. The temperature elevation of the transmission line type noise filter causes the life of the transmission line type noise filter to be shortened.

The temperature elevation of the first conductor 11 by the DC current and its solution by the present invention will be hereinbelow described in detail.

Figure 2:
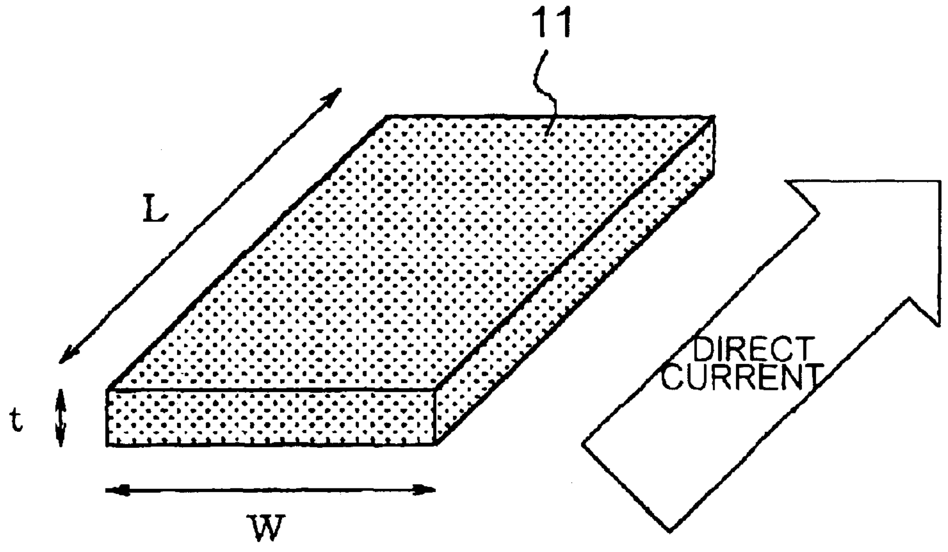
FIG. 2 is a schematic perspective view of a first conductor in the transmission line type noise filter according to the present invention, for use in describing relationships between the size and heat generation of the first conductor.

FIG. 2 is a schematic perspective view of the first conductor 11. The first conductor 11 has the length L, the width W, and the thickness t. The DC current flows in the first direction X as apparent from FIG. 2.

An amount of heat generated in the first conductor 11 is proportional to the resistance of the first conductor 11. When the first conductor 11 is constant in its shape and size in a plan view, the electrical resistance of the first conductor 11 is inversely proportional to the thickness t of the first conductor. Therefore, when the first conductor 11 is increased in its thickness, the heating value generated in the first conductor 11 is decreased. On the other hand, the increased thickness t of the first conductor 11 decreases heat radiation from the first conductor 11. The present inventors have found out an appropriate or adaptable range of the thickness t to balance the heat value generated in the first conductor 11 with the heat value radiated from the first conductor 11. More specifically, the adaptable range of the thickness t of the first conductor 11 was determined by the following investigation.

Figure 3:
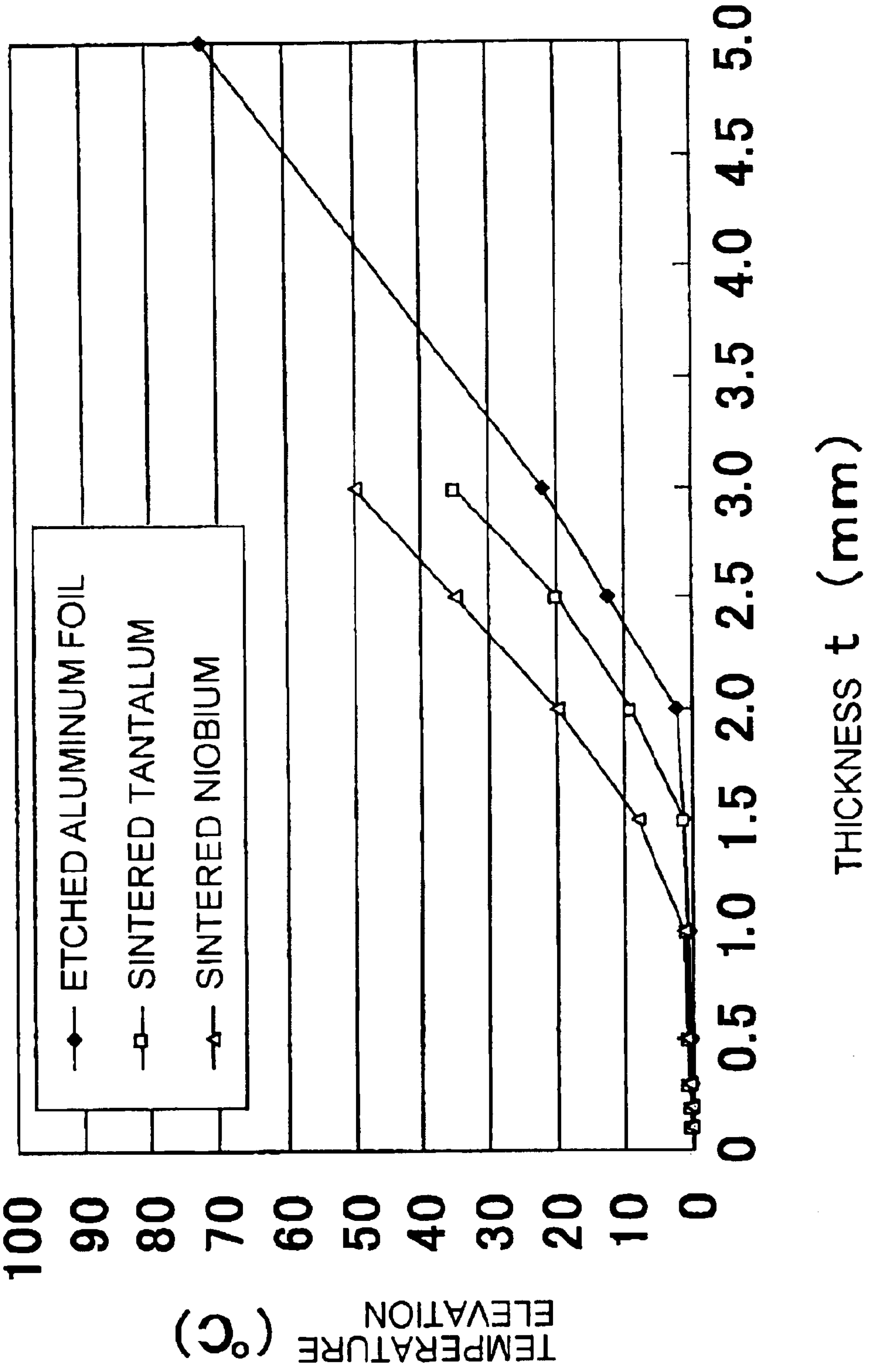
FIG. 3 is a graph showing results from a test for investigating a relationship between the temperature elevation and the thickness of the first conductor per different material used in the transmission line type noise filter according to the present invention.

FIG. 3 shows the test results regarding the temperature elevation of several samples for the first conductor 11. In the test, different samples of the first conductor 11 were made from an etched aluminum foil of the aluminum purity of 99.96%. The different samples have the same length L of 1 cm, the same width W of 1 cm, and different thicknesses of 0.01 to 5.0 mm. In order to investigate the relationship between the thickness t and the temperature elevation, a DC current of 30 A was continuously applied to flow through each of the samples for 60 seconds, when is sufficient for the temperature of each sample to be settled. The test results are shown in FIG. 3. It is noted from FIG. 3 that the thickness t of the first conductor 11 made essentially of aluminum should be 2.0 mm or less so as to substantially restrict the temperature elevation.

Furthermore, regarding other samples of the first conductor 11 made essentially of sintered tantalum and sintered niobium, respectively, the similar investigation was carried out. The test results are also shown in FIG. 3.

Consequently, it is noted from FIG. 3 that the thickness t of the first conductor 11 made essentially of tantalum should preferably be 1.5 mm or more so as to substantially restrict the temperature elevation. Further, the thickness t of the first conductor 11 made essentially of niobium should preferably be 1.0 mm or more.

Figure 4:
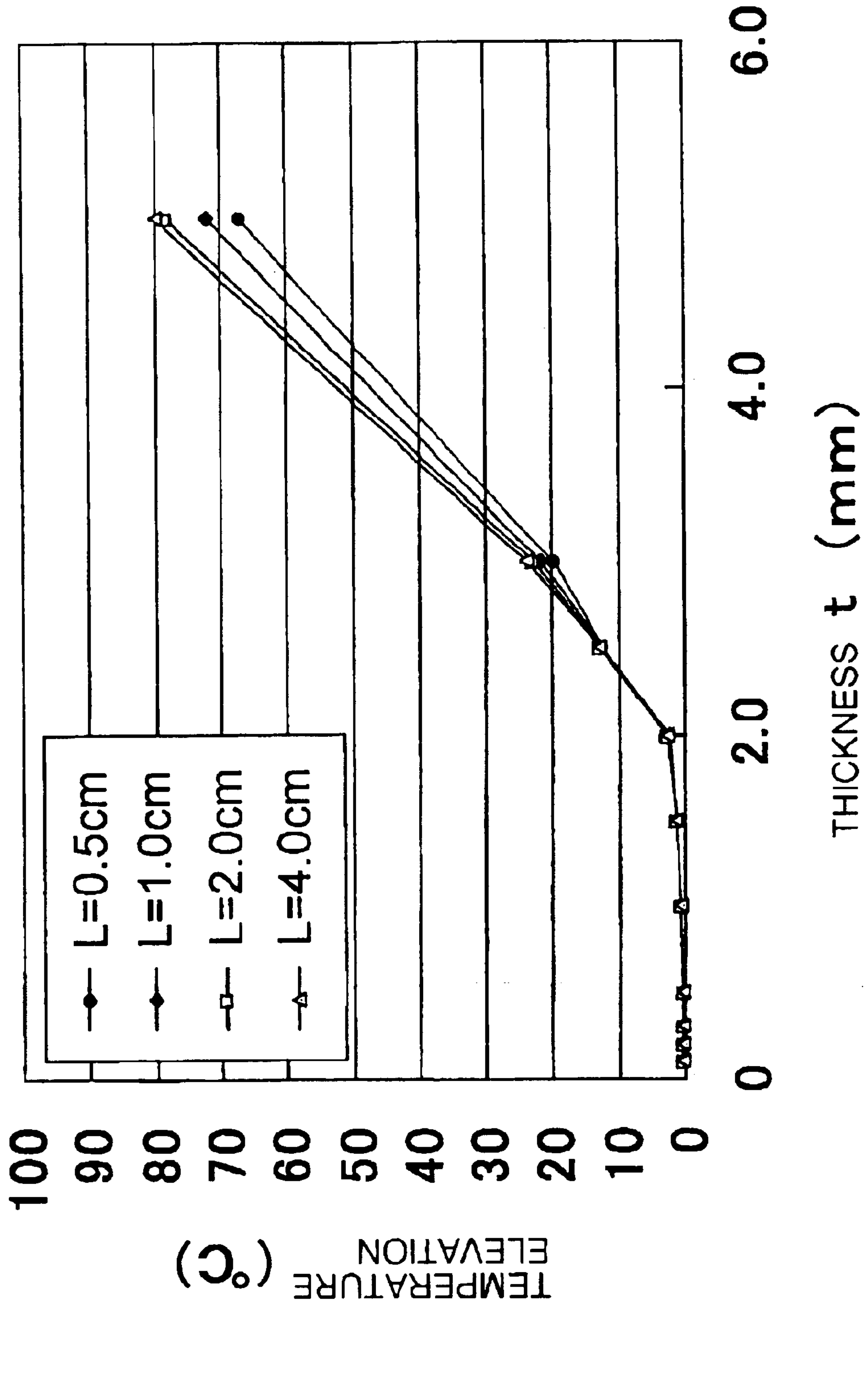
FIG. 4 is another graph showing results from another test for investigating a relationship among the temperature elevation, the thickness and the length of the first conductor used in the transmission line type noise filter according to the present invention.

FIG. 4 shows results from another test for investigating any effect of the length L of the first conductor 11 on the relationship between the temperature elevation and the thickness t of the first conductor 11. In this test, different samples were made from an etched aluminum foil of the aluminum purity of 99.96%. The different samples have different lengths L of 0.5, 1.0, 2.0, and 4.0 cm, the same width W of 1 cm, and different thicknesses of 0.01 to 5.0 mm. A DC current of 30 A was continuously applied to flow through each of the samples for 60 seconds, which is sufficient for the temperature of each sample to be settled. The test results are shown in FIG. 4. It is noted from FIG. 4 that the length L of the first conductor 11 has almost no affect on the relationship between the temperature elevation and the thickness t, and that the thickness t of the first conductor 11 made essentially of aluminum should be 2.0 mm or less so as to substantially restrict the temperature elevation.

Figure 5:
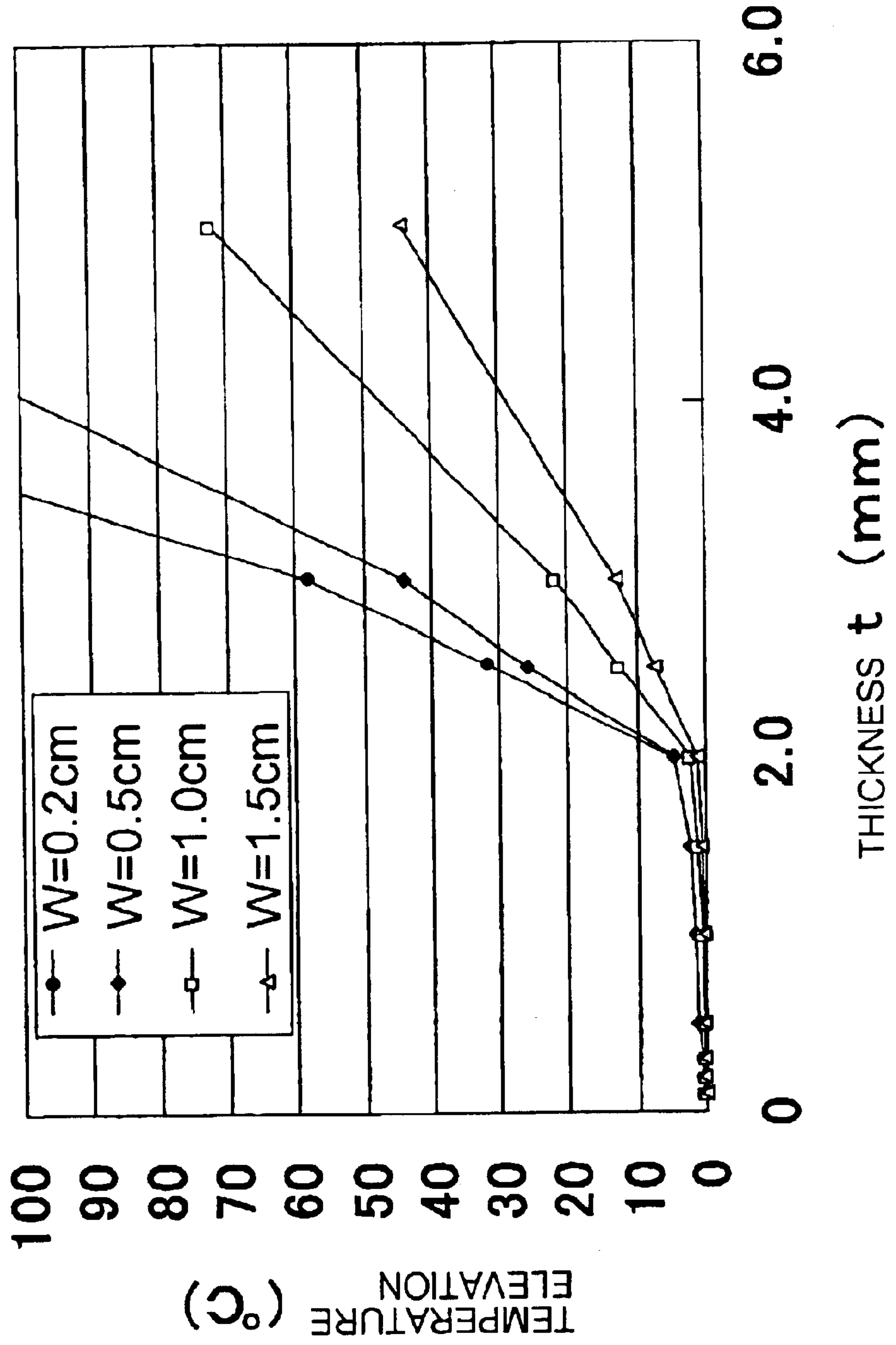
FIG. 5 is still another graph showing results from still another test for investigating a relationship among the temperature elevation, the thickness and the width of the first conductor used in the transmission line type noise filter according to the present invention.

FIG. 5 shows results from still another test for investigating any effect of the width W of the first conductor 11 on the relationship between the temperature elevation and the thickness t of the first conductor 11. In this test, different samples were made from an etched aluminum foil of the aluminum purity of 99.96%. The different samples have the same length L of 1 cm, different widths W of 0.2, 0.5, 1.0, and 1.5 cm, and different thicknesses of 0.01 to 5.0 mm. A DC current of 30 A was continuously applied to flow through each of the samples for 60 seconds, which is sufficient for the temperature of each sample to be settled. The test results are shown in FIG. 5. It is rioted from FIG. 5 that although difference of the width W of the first conductor 11 affects the temperature elevation when thickness t is more than 2.0 mm, the thickness t of the first conductor 11 should be 2.0 mm or less so as to substantially restrict the temperature elevation.

Figure 6:
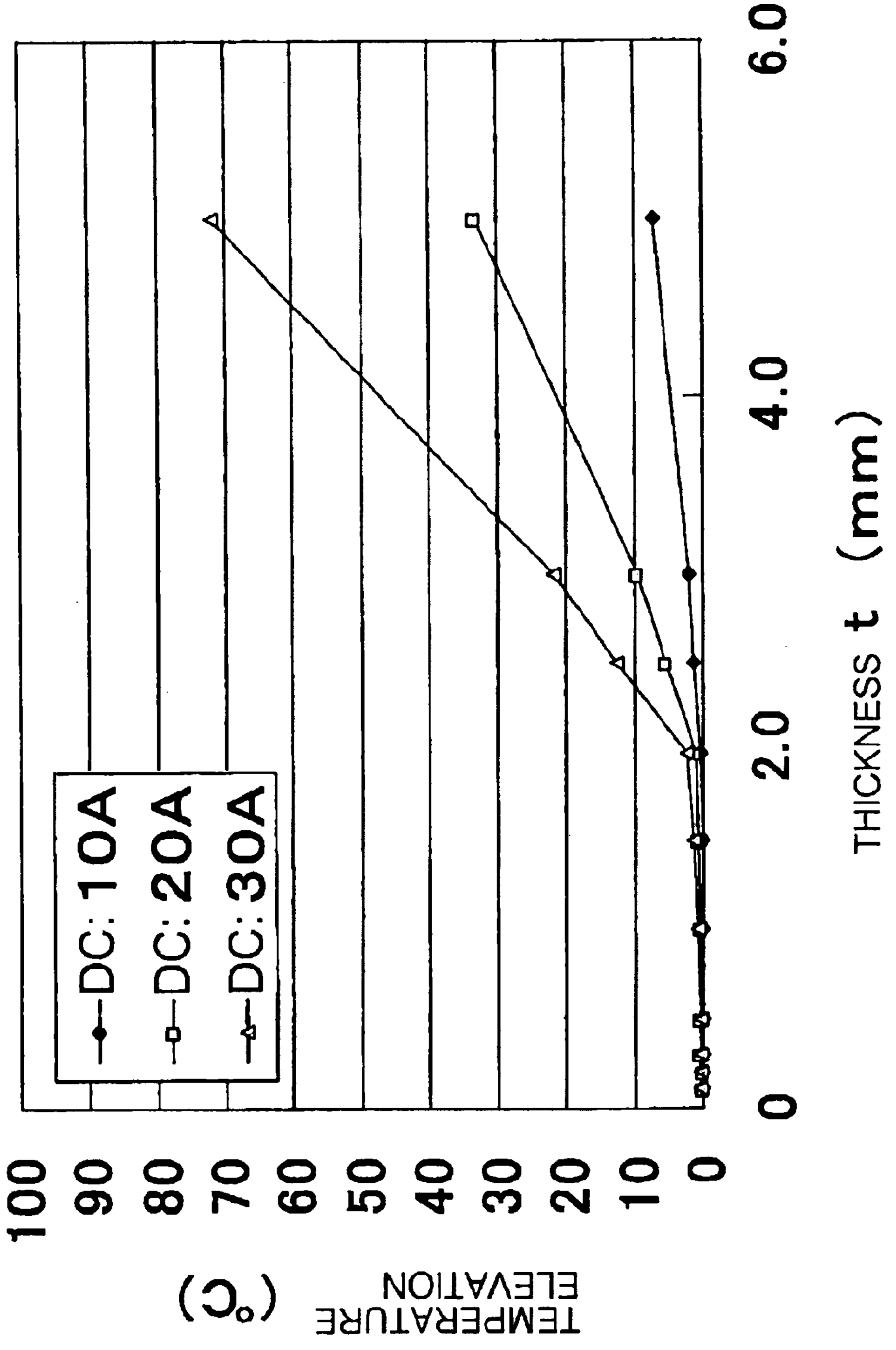
FIG. 6 is a further graph showing results from a further test for investigating a relationship among the temperature elevation and the thickness of the first conductor used in the transmission line type noise filter according to the present invention, and the DC current applied to the first conductor.

FIG. 6 shows further test results investigating affect of the DC current applied to the first conductor 11. In this test, different samples were also made from an etched aluminum foil of the aluminum purity of 99.96%. The different samples have the same length L of 1 cm, the same width W of 1 cm, and different thicknesses of 0.01 to 5.0 mm. Each of different DC currents of 5 A, 10 A, and 30 A was continuously applied to flow through each of the samples for 60 seconds. The test results are shown in FIG. 6. It is noted from FIG. 6 that although the value of the DC current affects the temperature elevation when thickness t is more than 2.0 mm, the thickness t of the first conductor 11 made essentially of aluminum should be 2.0 mm or less so as to substantially restrict the temperature elevation.

It is preferable that the thickness t of the first conductor 11 made of a material such as aluminum, tantalum, or niobium is not less than several $\mu$m, in order to secure the mechanical strength of the first conductor 11 and so on.

While the present invention has thus far been described in conjunction with several embodiments thereof, it will readily be possible for those skilled in the art to put the present invention into practice in various other manners.

For example, the noise filter according to the present invention can be connected to the LSI and be packaged with the LSI in a common package made of resin so that an LSI chip having a noise filter is structured.

What is claimed is:

1. A transmission line type noise filter connectable between a direct current power supply and an electrical load component for passing a coming DC current while attenuating a coming AC current, said transmission line type noise filter comprising:

- a first conductor formed in a plate shape and having a length along a first direction parallel to a transmission line, a width along a second direction perpendicular to said first direction, and a thickness along a third direction perpendicular to said first and said second directions;
- a dielectric layer formed on said first conductor;
- a second conductor formed on said dielectric;
- a first anode connected to one end portion of said first conductor in said first direction for connecting said first conductor to the direct current power supply; and a second anode connected to the other end portion of said first conductor in said first direction for connecting said first conductor to the electrical load component;

said second conductor serving as a cathode connectable to a standard potential;

said first and said second conductors and said dielectric layer providing a capacitance forming portion; and said thickness of said first conductor being selected to substantially restrict temperature elevation of said first conductor caused by DC current flowing in said first conductor.

2. The transmission line type noise filter according to claim 1, wherein said first conductor comprises valve-operational metal and said dielectric comprises an oxidized film of said valve-operational metal.

3. The transmission line type noise filter according to claim 2, wherein said valve-operational metal is aluminum, and wherein said thickness of said first conductor is 2.0 mm or less.

4. The transmission line type noise filter according to claim 2, wherein said valve-operational metal is tantalum, and wherein said thickness of said first conductor is 1.5 mm or less.

5. The transmission line type noise filter according to claim 2, wherein said valve-operational metal is niobium, and wherein said thickness of said first conductor is 1.0 mm or less.

6. The transmission line type noise filter according to claim 1, wherein said first conductor and said first and said second anodes are integrally formed in a metal sheet.

* * * * *

UNITED STATES PATENT AND TRADEMARK OFFICE

CERTIFICATE OF CORRECTION

PATENT NO. : 7,005,944 B2
APPLICATION NO. : 10/633199
DATED : February 28, 2006
INVENTOR(S) : Satoshi Arai et al.

It is certified that error appears in the above-identified patent and that said Letters Patent is hereby corrected as shown below:

On the Title page, item [56], References Cited:

Under Foreign Patent Documents,

| | | |
|---|---|---|
| insert -- | JP 08-083970 A | 3/1996 |
| | JP 11-074748 A | 3/1999 |
| | JP 11-144997 A | 5/1999 |
| | JP 2001-102243 A | 4/2001 |
| | JP 2002-164760 A | 6/2002 |
| | JP 2002-198268 A | 7/2002-- |

Signed and Sealed this

Eighth Day of July, 2008

JON W. DUDAS

*Director of the United States Patent and Trademark Office*